US010055043B2

(12) United States Patent
McDonald et al.

(10) Patent No.: US 10,055,043 B2
(45) Date of Patent: Aug. 21, 2018

(54) ACTUATOR ASSEMBLY FOR A WALLBOX DIMMER

(71) Applicant: LUTRON ELECTRONICS CO., INC., Coopersburg, PA (US)

(72) Inventors: Matthew Philip McDonald, Phoenixville, PA (US); Lawrence R. Carmen, Jr., Bath, PA (US)

(73) Assignee: LUTRON ELECTRONICS CO., INC., Coopersburg, PA (US)

(*) Notice: Subject to any disclaimer, the term of this patent is extended or adjusted under 35 U.S.C. 154(b) by 102 days.

(21) Appl. No.: 15/204,459

(22) Filed: Jul. 7, 2016

(65) Prior Publication Data

US 2016/0320892 A1   Nov. 3, 2016

Related U.S. Application Data

(62) Division of application No. 13/782,569, filed on Mar. 1, 2013, now Pat. No. 9,414,471.

(51) Int. Cl.
| | |
|---|---|
| *G09G 5/00* | (2006.01) |
| *G06F 3/041* | (2006.01) |
| *H05B 39/08* | (2006.01) |
| *H03K 17/96* | (2006.01) |
| *H05B 33/08* | (2006.01) |

(52) U.S. Cl.
CPC ....... *G06F 3/0414* (2013.01); *H03K 17/9625* (2013.01); *H05B 33/0845* (2013.01); *H05B 39/08* (2013.01)

(58) Field of Classification Search
CPC ... G06F 3/044; G06F 3/0414; H05B 33/0845; H05B 39/08

USPC .......... 345/173–178; 315/36, 306, 307, 224, 315/291–297
See application file for complete search history.

(56) References Cited

U.S. PATENT DOCUMENTS

| | | |
|---|---|---|
| 4,595,913 A | 6/1986 | Aubuchon |
| 7,566,995 B2 | 7/2009 | Altonen et al. |
| 7,592,925 B2 | 9/2009 | Nearhoof et al. |
| 7,608,948 B2 | 10/2009 | Nearhoof et al. |
| 7,641,491 B2 | 1/2010 | Altonen et al. |
| 7,791,595 B2 | 9/2010 | Altonen et al. |

(Continued)

*Primary Examiner* — Jennifer Nguyen
(74) *Attorney, Agent, or Firm* — Amy Yanek; Glen Farbanish

(57) ABSTRACT

A wall-mounted dimmer may include an actuator assembly configured to translate a touch interaction with the dimmer into a desired dimming level. The actuator assembly may include a control interface having a resilient, deflectable membrane, a plurality of force-sensitive impedance members supported by the membrane, and an actuator configured to transfer a touch along the actuator to the membrane, causing the membrane to actuate one or more corresponding force-sensitive impedance members. The force-sensitive impedance members may be configured to make contact with corresponding ones of a plurality of open circuit pads supported by a printed circuit board. Each of the plurality of open circuit pads may correspond to a predetermined dimming level applied to a lighting load electrically connected to the dimmer. The control interface may be configured such that contact between the force-sensitive impedance members and corresponding ones of the open circuit pads is pressure sensitive.

13 Claims, 10 Drawing Sheets

(56) References Cited

U.S. PATENT DOCUMENTS

| | | |
|---|---|---|
| 7,855,543 B2 | 12/2010 | Newman, Jr. et al. |
| 7,896,674 B2 | 3/2011 | Altonen et al. |
| 7,948,393 B2 | 5/2011 | Nearhoof et al. |
| 8,040,080 B2 | 10/2011 | Newman, Jr. et al. |
| 8,098,029 B2 | 1/2012 | Newman, Jr. et al. |
| 8,173,920 B2 | 5/2012 | Altonen et al. |
| 2004/0203525 A1 | 10/2004 | Gillette et al. |
| 2007/0289860 A1* | 12/2007 | Newman ............. G06F 3/03547 200/522 |
| 2008/0168403 A1* | 7/2008 | Westerman ......... G06F 3/04883 715/863 |
| 2008/0230283 A1* | 9/2008 | Yoon .................... G06F 3/0202 178/18.11 |

\* cited by examiner

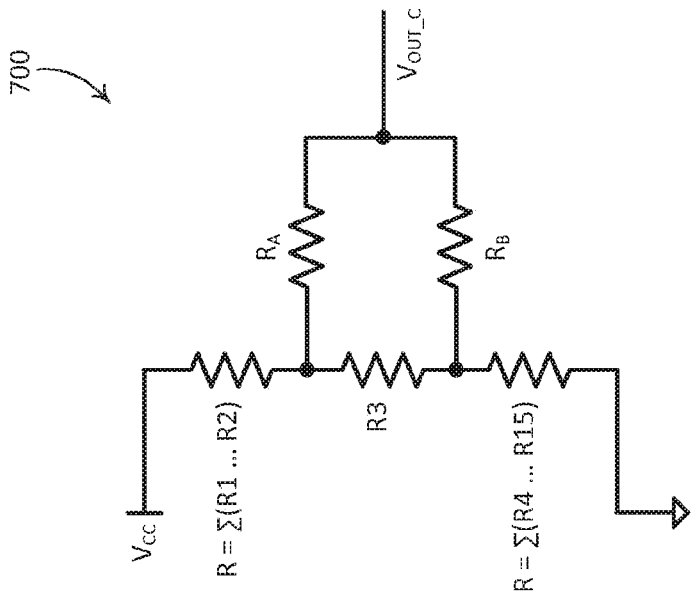
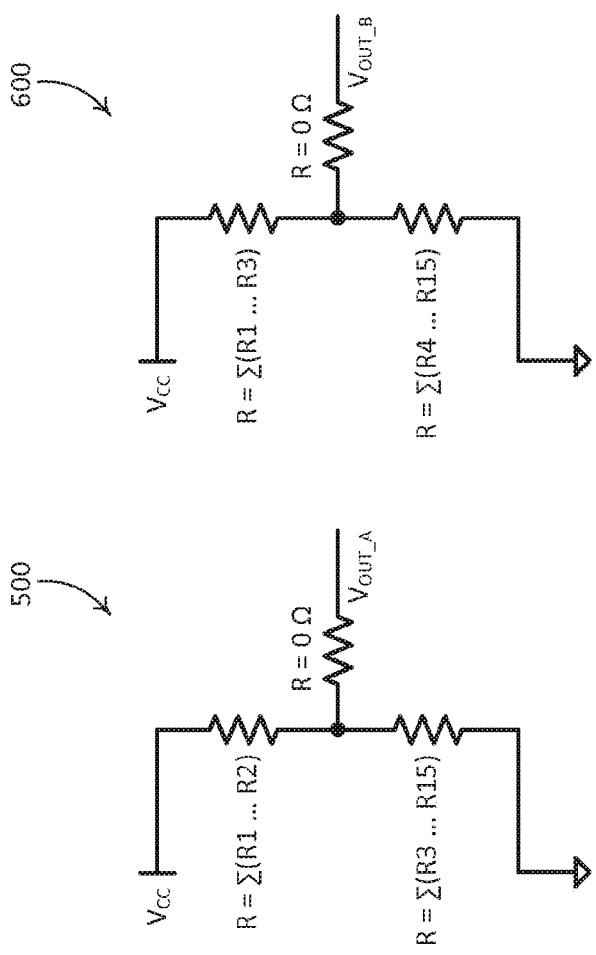
FIG. 10A    FIG. 10B    FIG. 10C

_US 10,055,043 B2_

ACTUATOR ASSEMBLY FOR A WALLBOX DIMMER

CROSS REFERENCE TO RELATED APPLICATIONS

This application is a divisional of U.S. patent application Ser. No. 13/782,569, filed Mar. 1, 2013, now U.S. Pat. No. 9,414,471, issued Aug. 9, 2016, which is incorporated herein by reference in its entirety.

BACKGROUND

Load control devices may be used to control the amount of power delivered from an alternating current (AC) power source to an electrical load. An example of such a load control device is a wall-mounted dimmer.

FIG. 1 depicts a faceplate 10 and an actuator 12 of a prior art wall-mounted dimmer switch. The actuator 12 protrudes through an opening 14 in the faceplate 10, so as to be accessible to a user of the dimmer switch. The actuator 12 has an upper portion 16 and a lower portion 18. A user of the dimmer switch may adjust an amount of power the dimmer provides to a lighting load by sliding a finger along the upper portion 16 of the actuator 12. The user may switch the power to the lighting load on or off by touching the lower portion 18 of the actuator 12.

FIG. 2 depicts an exploded view of an example prior art wall-mounted dimmer switch 50 that may include a faceplate and an actuator, for example the faceplate 10 and the actuator 12 depicted in FIG. 1. The dimmer switch 50 includes a resistive touch pad 20 configured to be actuated by the actuator 12. The resistive touch pad 20 is configured to receive X and Y inputs from the actuator 12. The actuator 12 includes a plurality of legs 22 that are configured to make contact with the resistive touch pad 20. The legs 22 are spaced apart from each other along the actuator 12.

A user of the dimmer switch 50 may control an amount of power delivered to a lighting load by the dimmer switch by pressing a contact location on the actuator 12. As a user presses the actuator 12 at the contact location, the actuator 14 will cause one or more of the legs 22 to contact the resistive touch pad 20 at a corresponding contact location, for example a point having X and Y coordinates.

The contact location may provide an indication of a desired dimming level to be applied to the electrical load by the dimmer switch 50. The user may select a desired dimming level by pressing the actuator 12 at a contact location that corresponds to the desired dimming level. The dimmer switch 50 may include a controller that is configured to receive the contact location (e.g., X and Y coordinates) from the resistive touch pad 20. The dimmer switch 50 may translate the Y coordinate of the contact location into the desired dimming level and may use the X coordinate to determine if the actuator 12 is presently being actuated. The controller may cause a semiconductor switch of the dimmer switch 50 to deliver an amount of power to the lighting load that corresponds to the desired dimming level. An example of a dimmer switch, such as the dimmer switch 50 having the resistive touch pad 20, is described in greater detail in U.S. Pat. No. 8,173,920, issued May 8, 2012, entitled "Load Control Device Having A Modular Assembly," the entire disclosure of which is hereby incorporated by reference.

The use of touch pad technology may be undesirably expensive. For example, resistive touch pads, such as the resistive touch pad 20, tend to be expensive because they are difficult to manufacture and include expensive materials, for example indium-tin oxide (ITO).

SUMMARY

As disclosed herein, a wall-mounted load control device (e.g., a dimmer switch) may include an actuator assembly configured to translate a touch interaction with the dimmer switch into a desired dimming level and to apply the desired dimming level to a lighting load electrically connected to the dimmer.

The actuator assembly may include a control interface having a resilient, deflectable membrane and a linear array of circuit actuators supported by the membrane. The linear array of circuit actuators may include a plurality of force-sensitive impedance members. The control interface may include an actuator configured to transfer a touch interaction at a particular location along the actuator to the membrane, causing the membrane to deflect and to actuate one or more of the plurality of force-sensitive impedance members. A touch interaction may include a user applying a force to the actuator, for example using a finger.

The array of force-sensitive impedance members may include a plurality of activated carbon structures, for example a plurality of carbon pills. The plurality of carbon pills may make contact with corresponding locations on a printed circuit board (PCB) when the membrane is deflected under a touch interface applied to the actuator. The PCB may define a surface supporting a plurality of open circuit pads. Each open circuit pad may be configured to be closed by a corresponding one of the carbon pills, for example when a touch interaction is applied to the actuator at a location proximate to the corresponding one of the carbon pills.

A touch interaction applied to the actuator may cause one or more of the carbon pills to make contact with corresponding ones of the open circuit pads. If the touch interaction includes actuation of one of the plurality of carbon pills against a corresponding open circuit pad with full pressure, the carbon pill may close the open circuit. The closed circuit may output a signal that may be sent to the controller. The controller may translate the signal into a desired dimming level to be applied to the lighting load.

When one or more of the plurality of carbon pills are actuated with less than full pressure, the one or more carbon pills may contributes some resistance value to corresponding ones of the open circuits, such that the open circuits are at least partially closed. The one or more partially closed circuits may output respective signals that may be sent to the controller. The controller may use the respective signals to determine a desired dimming level to be applied to the lighting load.

BRIEF DESCRIPTION OF THE DRAWINGS

FIG. 10A depicts an equivalent circuit of the switching circuit illustrated in FIG. 9, when a first one of the plurality of open circuits is closed by a force applied to a corresponding force-sensitive impedance member.

FIG. 10B depicts an equivalent circuit of the switching circuit illustrated in FIG. 9, when a second one of the plurality of open circuits is closed by a force applied to a corresponding force-sensitive impedance member.

FIG. 10C depicts an equivalent circuit of the switching circuit illustrated in FIG. 9, when two of the plurality of open circuits are closed by a force applied between two corresponding force-sensitive impedance members.

DETAILED DESCRIPTION

Figure 1:
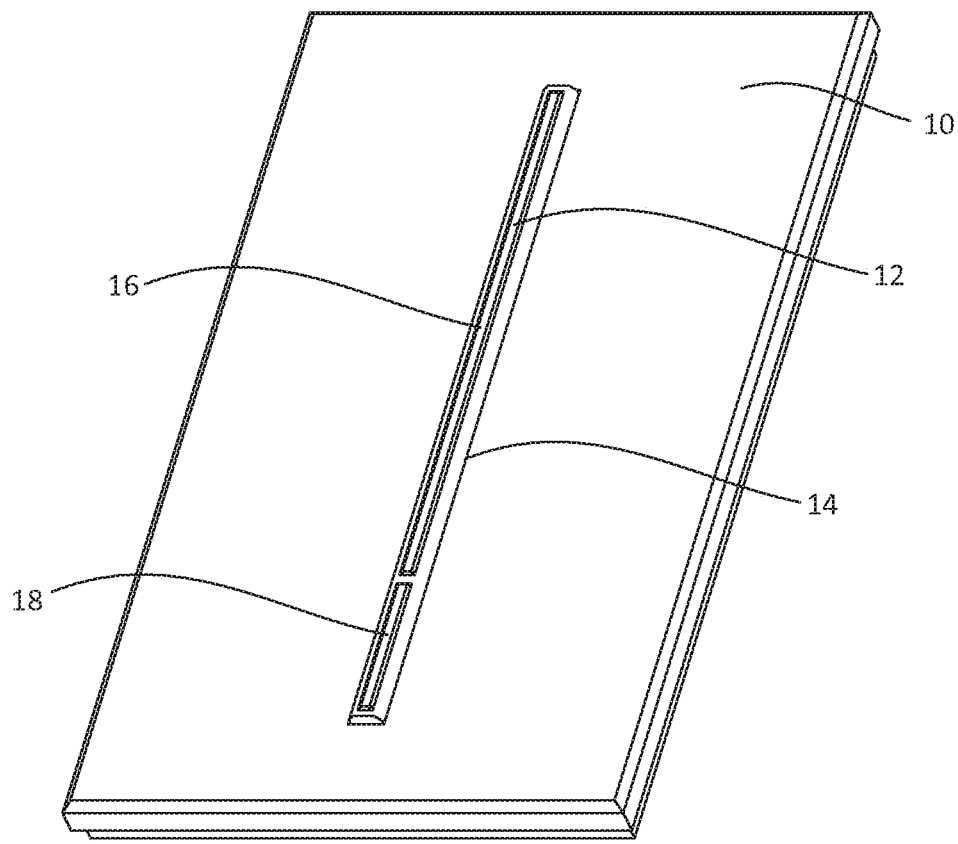
FIG. 1 is a perspective view of an example prior art user interface configured for use with a wall-mounted dimmer switch.
Figure 2:
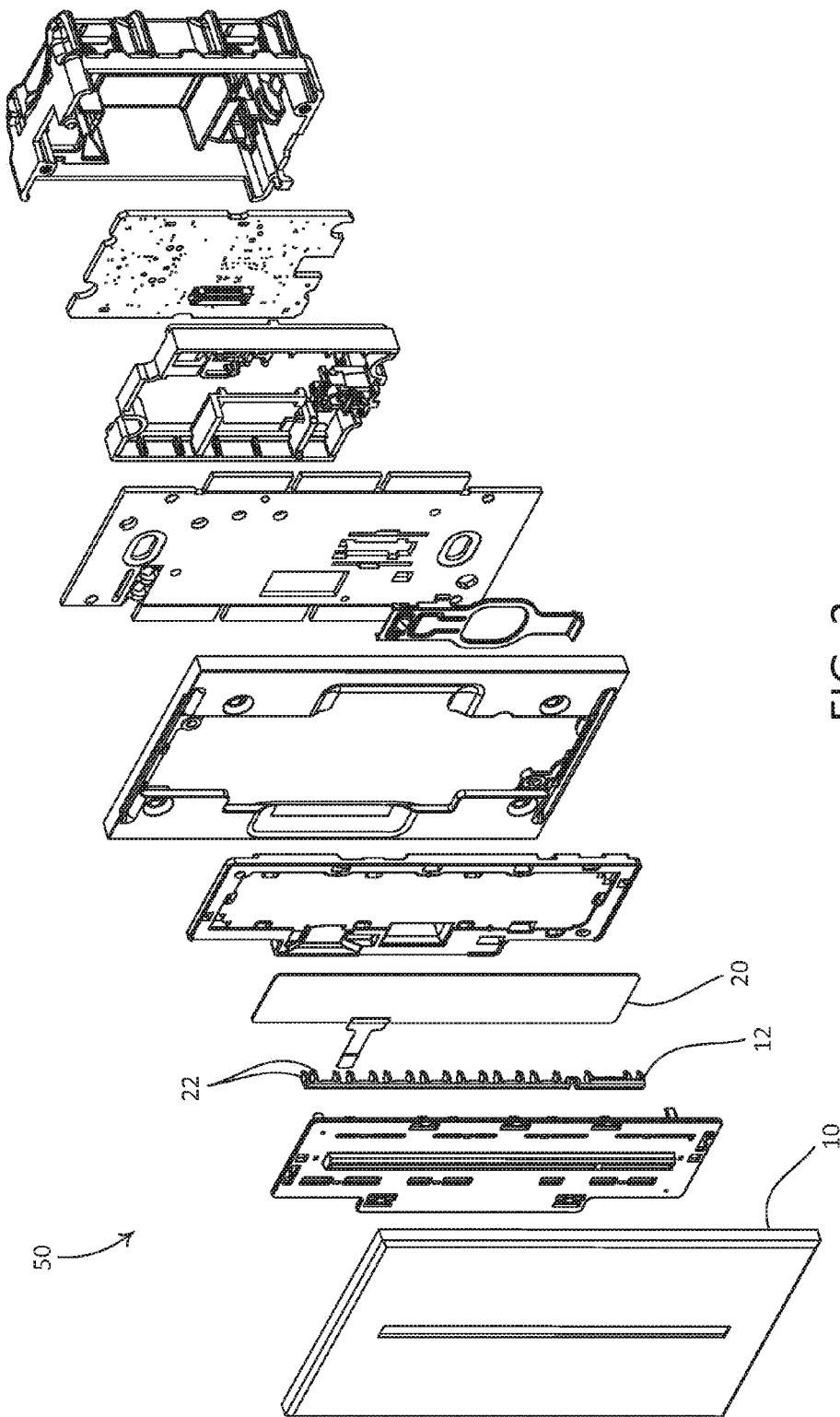
FIG. 2 is an exploded view of an example prior art wall-mounted dimmer switch having a touch interactive user interface.
Figure 3:
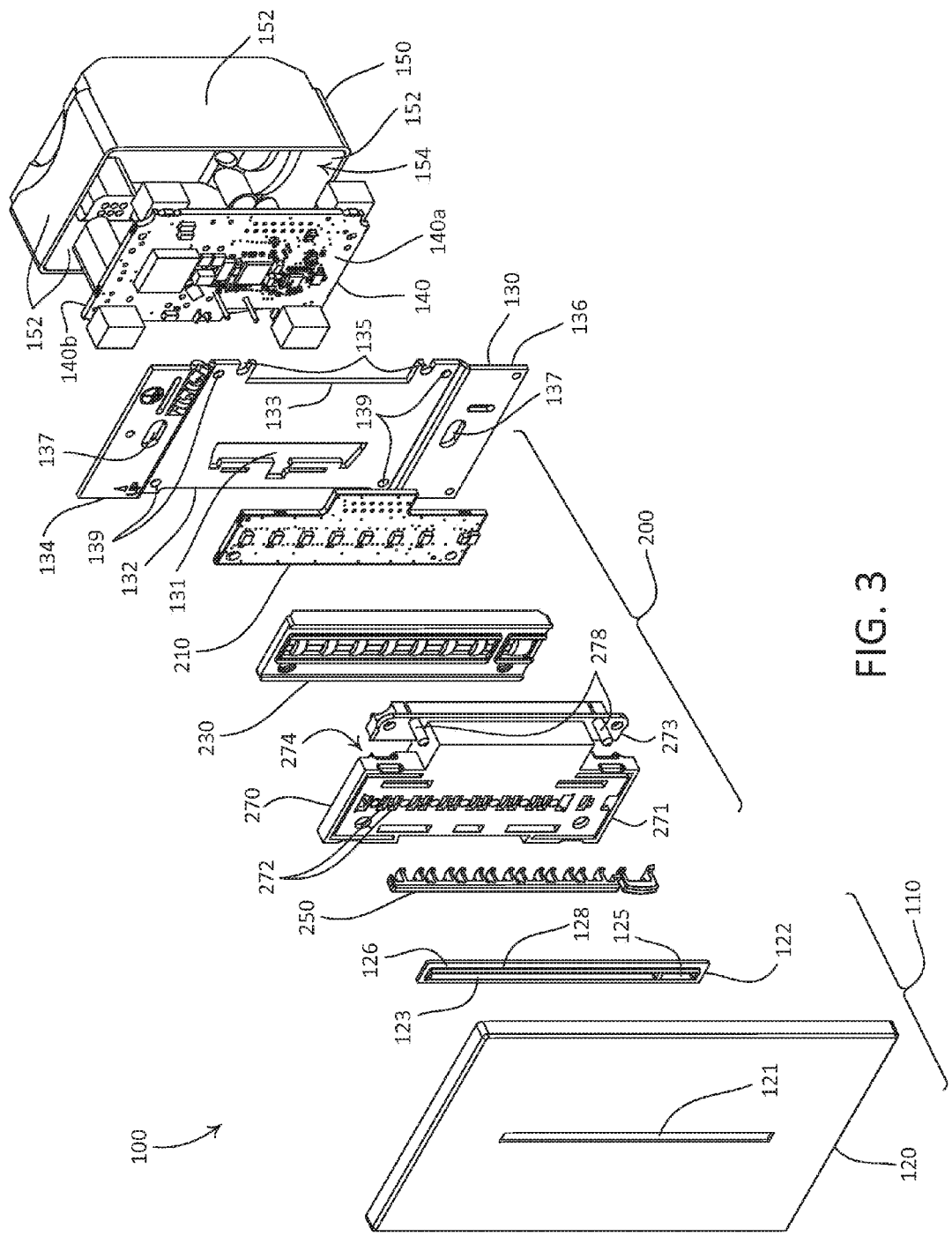
FIG. 3 is an exploded view of an example wall-mounted dimmer switch having a touch interactive user interface.

FIG. 3 is an exploded view of an example load control device 100. The load control device 100 may be an electronic switch or dimmer switch. The load control device 100 may be coupled in series electrical connection between an alternating current (AC) source AC source and an electrical load for controlling an amount of power delivered from the AC source to the electrical load.

As shown, the load control device 100 includes a faceplate assembly 110, a touch-sensitive actuator assembly 200, a yoke 130, a printed circuit board (PCB) 140, and a rear cover 150. The actuator assembly 200 may include a printed circuit board (PCB) 210, a resilient, deformable membrane 230, a plurality of force-sensitive impedance members 242 (not shown in FIG. 3), an actuator 250, and a cradle 270. The load control device 100 may include one or more fasteners (not shown) for securing one or more of the components of the load control device 100 in an assembled configuration.

The rear cover 150 may be sized to be received in a standard wallbox. The rear cover 150 may be made of any suitable material, for example plastic. As shown, the rear cover 150 includes a plurality of walls 152 that define a cavity 154. The cavity 154 may be configured to receive one or more of the components of the load control device 100, for example the PCB 140.

The PCB 140 may be referred to as a first, or main, PCB of the load control device 100. As shown, the PCB 140 includes a substrate body that defines an outward facing first surface 140a of the PCB 140 and an opposed inward facing second surface 140b. The substrate body may be sized such that at least a portion of the PCB 140 may be received in the cavity 154 of the rear cover 150. One or more electrical components may be attached (e.g., mounted) to one or both of the first and second surfaces 140a, 140b of the PCB 140 and placed in electrical communication with electrical circuits (e.g., circuit traces) defined on the first and second surfaces 140a, 140b and/or in the substrate body of the PCB 140.

The yoke 130 may be made of any suitable material, such as a metal, for example. As shown, the yoke 130 includes a plate shaped body having a middle section 132, an upper tab section 134, and a lower tab section 136. The upper and lower tab sections 134, 136, are substantially coplanar with, and offset from, the middle section 132. In this regard, the middle section 132 can be referred to as a recessed section of the yoke 130, relative to the upper and lower tab sections 134, 136. The yoke 130 may be configured to at least partially receive one or more components of load control device 100. As shown, the middle section 132 of the yoke 130 defines an opening 131, a slot 133, and a pair of notches 135 disposed on opposed sides of the slot 133. The cradle 270 can be releasably attached to the yoke 130, for example, by manipulating the cradle 270 such that corresponding structures of the cradle are disposed into the opening 131, the slot 133, and the notches 135.

The upper and lower tab sections 134, 136 are configured to facilitate attachment of the load control device 100 to a suitable receptacle, for example a wallbox. One or more of the middle section 132, the upper tab section 134, or the lower tab section 136 of the yoke 130 may define respective apertures (e.g., apertures 137, 139) that extend therethrough. The apertures 137 in the upper and lower tab sections 134, 136 may be sized to receive attachment members (e.g., screws) to facilitate attachment of the yoke 130 to an electrical wallbox (e.g., a metal or plastic wallbox). The apertures 139 in the middle section 132 of the yoke 130 may be sized to receive screws to facilitate attachment of the yoke 130 to the rear cover 150.

The illustrated faceplate assembly 110 includes a faceplate 120 and a bezel 122 that is configured to be attached to the faceplate 120. The faceplate 120 and the bezel 122 may be made of any suitable material (e.g., plastic or metal). The faceplate 120 may have any suitable shape, such as the illustrated substantially flat, rectangular shape. The faceplate 120 defines an opening 121 that is sized to receive at least a portion of the bezel 122. The faceplate 120 may be configured to be releasably attached to one or more other components of the load control device 100. The faceplate 120 may include one or more latch members, for example, that extend inwardly from an inward facing surface of the faceplate 120 and are configured to releasably engage with complementary latch members supported by the cradle 270.

The bezel 122 includes a body that defines a base portion 126 and a trim portion 128 that extends outward from the base portion 126. The trim portion 128 defines an outer perimeter that is dimensioned such that the trim portion 128 is configured to be disposed into, and protrude beyond, the opening 121. The base portion 126 defines an outer perimeter that is dimensioned such that base portion abuts an inward facing surface of the faceplate 120 when the trim portion 128 is in an inserted position in the opening 121. The bezel 122 may be configured to be releasably attached to the faceplate 120. The trim portion 128 may be dimensioned to create a friction fit within the opening 121. The bezel 122 defines first and second openings 123, 125 that extend through the body of the bezel 122. The first and second openings 123, 125 are sized to receive corresponding portions of the actuator 250. It should be appreciated that the load control device 100 is not limited to the illustrated faceplate assembly 110, and that the load control device 100 may be alternatively configured for use with any other suitable faceplate (e.g., a two piece faceplate with an adapter), or with no faceplate.

Figure 4:
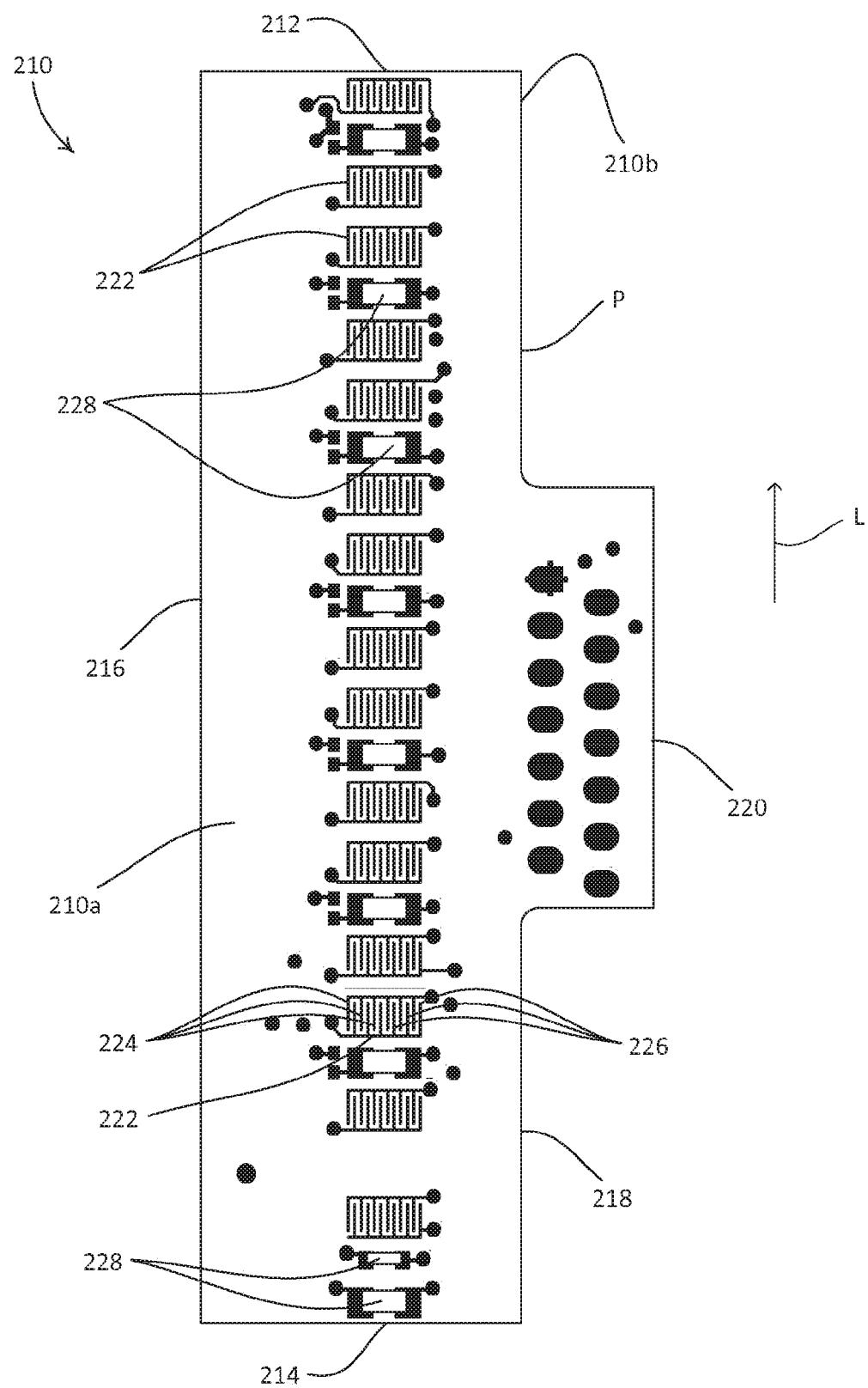
FIG. 4 is a top elevation view of an example printed circuit board for use in a wall-mounted dimmer switch, the printed circuit board having electrical traces defining a plurality of open circuits.

The PCB 210 may be referred to as a second, or front, PCB of the load control device 100. As shown in FIG. 4, the PCB 210 includes a substrate body that defines an outward facing first surface 210a of the PCB 210 and an opposed inward facing second surface 210b. The substrate body of the illustrated PCB 210 defines a top edge 212 which may be referred to as a first end, an opposed bottom edge 214 which may be referred to as a second end, a first side edge 216, an opposed second side edge 218, and a bump out 220 that extends from the second side edge 218. The PCB 210 is elongate along a longitudinal direction L between the first and second ends. The top, bottom, first side, and second side edges 212, 214, 216, 218, and the bump out 220 define an outer perimeter P of the PCB 210.

One or more electrical components may be attached (e.g., mounted) to one or both of the first and second surfaces 210a, 210b of the PCB 210 and placed in electrical communication with electrical circuits (e.g., circuit traces) defined on the first and second surfaces 210a, 210b and/or in the substrate body of the PCB 210.

Figure 9:
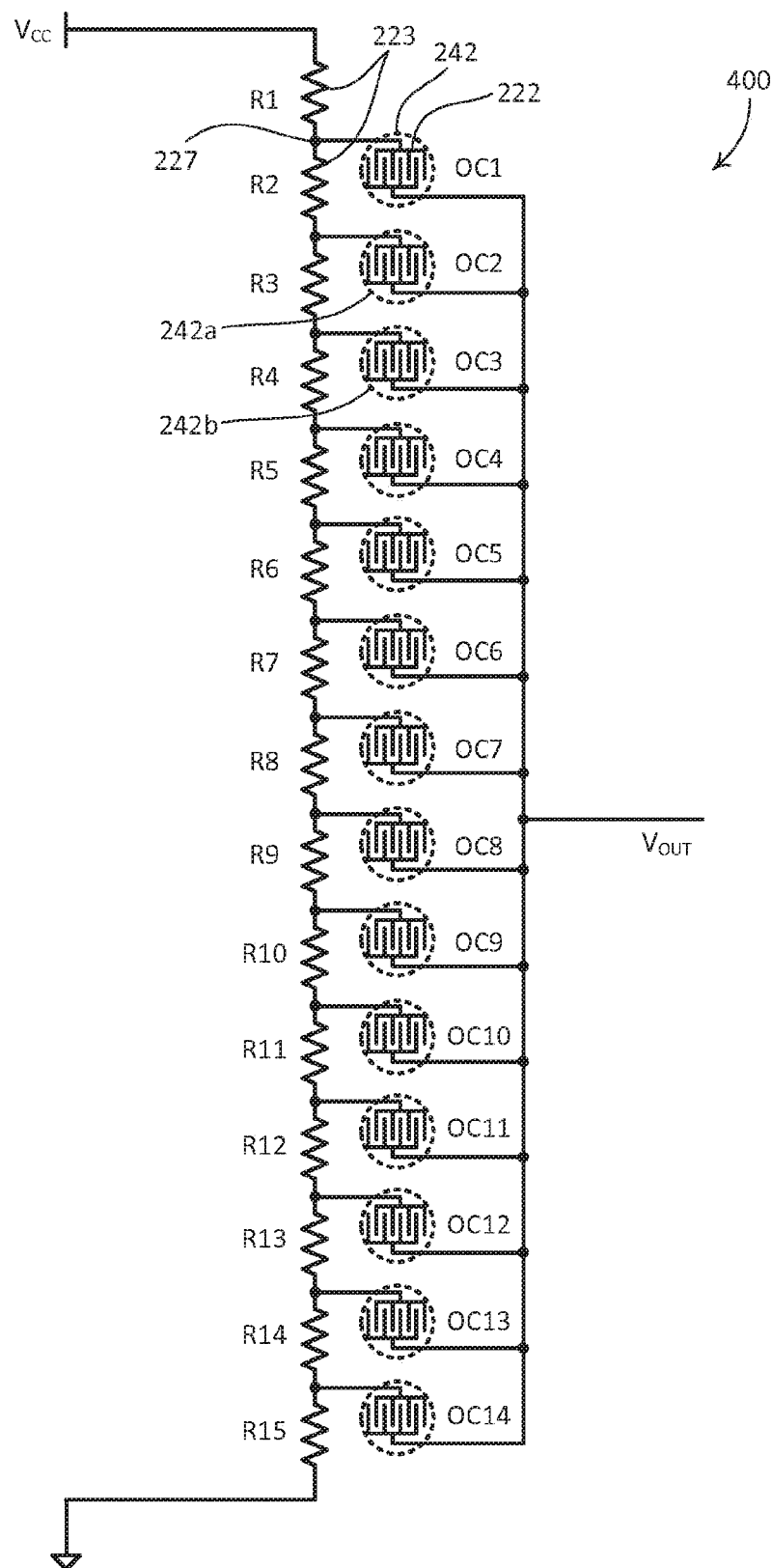
FIG. 9 is a circuit diagram depicting an example switching circuit having a plurality of open circuits, each open circuit configured to be closed by one of a plurality of force-sensitive impedance members.

As shown, the first surface 210a supports a plurality of open circuit pads 222 that define a plurality of open circuits. The plurality of open circuit pads 222 are arranged in a linear array along the longitudinal direction L. The second surface 210b supports a plurality of resistors 223 (e.g., as depicted in FIG. 9). The plurality of resistors 223 may be arranged in a linear array along the longitudinal direction L. Each resistor 223 is electrically connected to one or more of the plurality of open circuit pads 222. Each open circuit pad 222 may include a plurality of first electrical trace fingers 224 and a plurality of second electrical trace fingers 226. The pluralities of first and second electrical trace fingers 224, 226 are interleaved with respect to each other, such that a conductive element (e.g., a force-sensitive impedance members 242 as shown in FIG. 6) that makes contact with at least one first electrical trace finger 224 of the plurality of first electrical trace fingers 224 and at least one first electrical trace finger 226 of the plurality of second electrical trace fingers 226 may close the corresponding open circuit defined the open circuit pad 222.

Each open circuit pad 222 may correspond to a predetermined dimming level of the load control device 100. For example, when one or more of the open circuit pads 222 is closed (e.g., by respective conductive elements), a voltage having a select magnitude may be generated and may be translated by the load control device 100, for example by a controller of the load control device 100, into a desired dimming level to be applied to an electrical load.

The PCB 210 may include a plurality of visual indicators configured to provide feedback to a user of the load control device 100, for example to indicate a current dimming level of the load control device 100 (e.g., as selected by the user using the actuator 250). As shown, the PCB 210 includes a plurality of visual indicators (e.g., a plurality of light emitting diodes (LEDs) 228) attached to the first surface 210a of the PCB 210 and arranged in a linear array along the longitudinal direction L. The LEDs 228 of the plurality of LEDs 228 are spaced from each other along the longitudinal direction L, between the top and bottom edges 212, 214 of the PCB 210.

Figure 5:
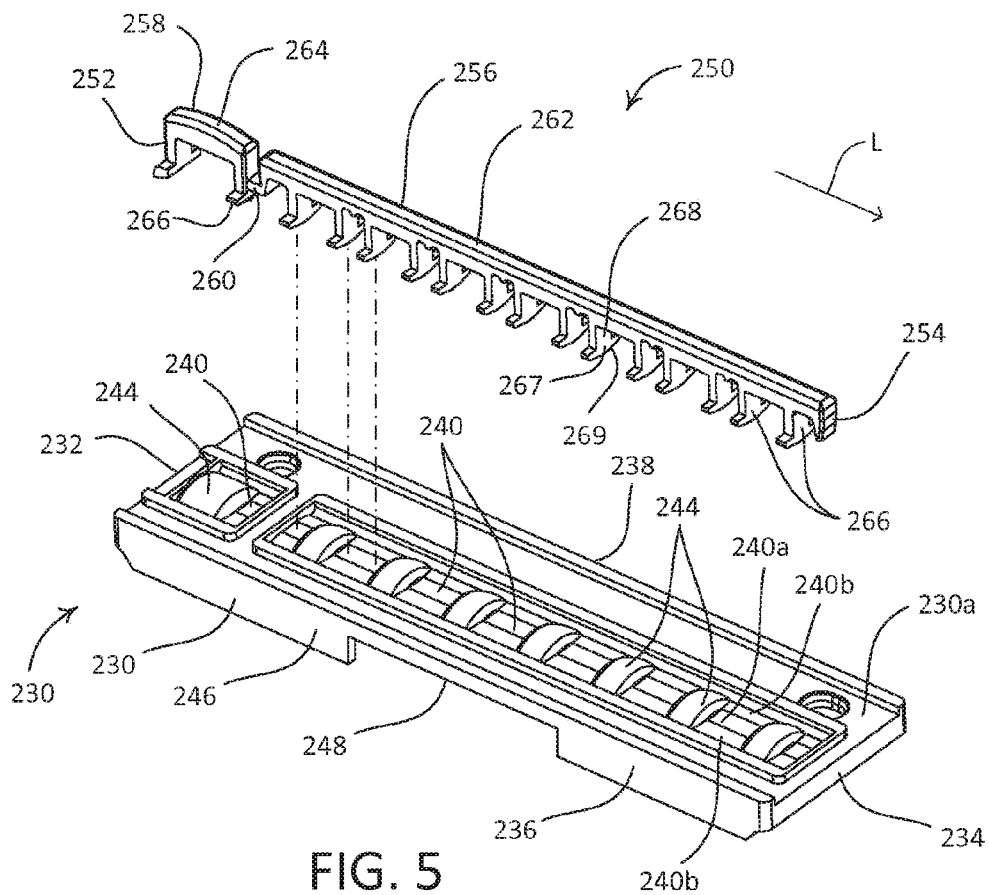
FIG. 5 is a perspective view of an example actuator and the outer surface of an example resilient, deformable membrane configured to support a plurality of force-sensitive impedance members.
Figure 6:
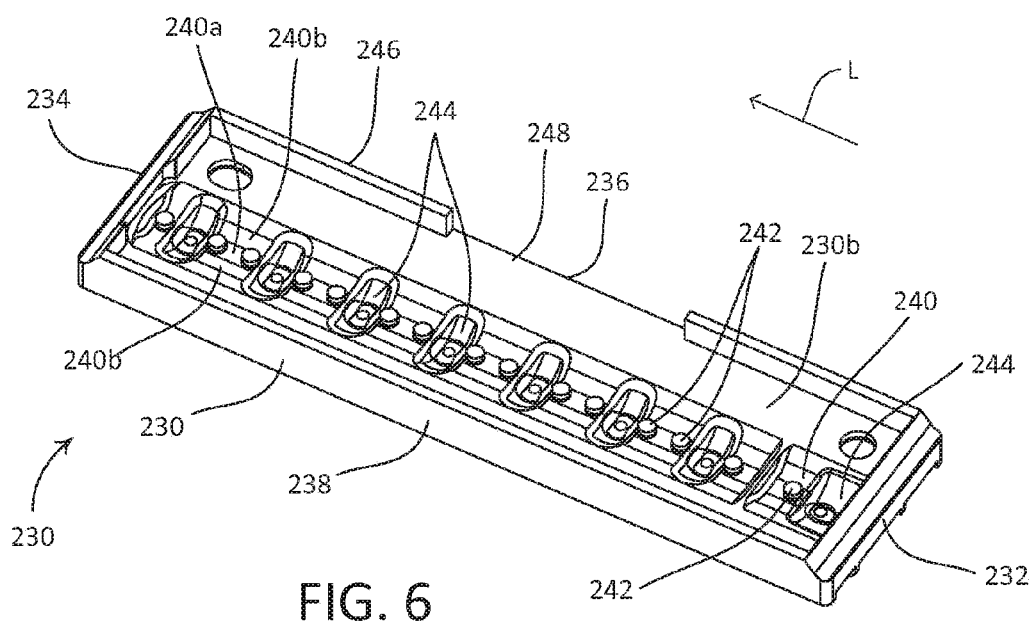
FIG. 6 is a perspective view of an inner surface of the deformable membrane depicted in FIG. 5, illustrating a plurality of force-sensitive impedance members arranged in a linear array.

FIGS. 5 and 6 depict the actuator 250 and the membrane 230. The actuator 250 and the membrane 230 may be configured to cooperate to allow a user of the load control device 100 to select a desired amount of power to delivered to an electrical load controlled by the load control device 100 (e.g., a desired dimming level to be applied to a lighting load). The membrane 230 may be made of a resilient, deformable material, for example rubber. The membrane 230 may define any suitable shape, for example the illustrated substantially rectangular shape. As shown, the membrane 230 has a body that defines an outward facing upper surface 230a and an opposed inward facing lower surface 230b. The body of the membrane 230 defines a first end 232, an opposed second end 234, a first side 236, and an opposed second side 238. The membrane 230 is elongate, along the longitudinal direction L, between the first and second ends 232, 234. In an assembled load control device 100, the first end 232 may be referred to as a lower end and the second end 234 may be referred to as an upper end.

The membrane 230 defines a plurality of actuation pockets 240 arranged in a linear array along the longitudinal direction L, between the first and second ends 232, 234. The plurality of actuation pockets 240 are recessed into the upper surface 230a of the membrane 230 and are configured to be deformably actuated by the actuator 250. As shown, each actuation pocket 240 defines three planar contact surfaces including a medial contact surface 240a and a pair of opposed flanking contact surfaces 240b. The medial contact surface 240a may substantially coplanar with the upper surface 230a of the membrane 230. Each flanking contact surface 240b may taper inward, away from the upper surface 230a and toward a corresponding one of the first or second sides 236, 238 of the membrane 230. It should be appreciated that the actuation pockets 240 may be alternatively configured. For example, one or more of the actuation pockets 240 (e.g., each actuation pocket 240) may define a smooth contact surface that may be convex, concave, or substantially coplanar with respect to the upper and/or lower surfaces 230a, 230b of the membrane 230.

The membrane 230 may support a plurality of discrete, force-sensitive impedance members 242, such that each of the force-sensitive impedance members 242 may be actuated into contact with a corresponding one of the plurality of open circuit pads 222 supported by the PCB 210. The plurality of force-sensitive impedance members 242 may be arranged in a linear array along the longitudinal direction L. Each force-sensitive impedance member 242 may be attached to the lower surface 230b of the membrane, in a location corresponding to one of the actuation pockets 240 (e.g., to the medial contact surface 240a of an actuation pocket 240). Each actuation pocket 240 may have one, two, or more force-sensitive impedance members 242 attached thereto. As shown, the plurality of force-sensitive impedance members 242 includes a plurality of activated carbon structures configured as carbon pills. The activated carbon structures may define any suitable shape, for example a substantially cylindrical shape as illustrated.

The membrane 230 may define a plurality of lenses 244 that are configured to enhance the visibility of (e.g., focus the light from) the plurality of visual indicators (e.g., the plurality of LEDs 228). As shown, the lenses 244 of the plurality of lenses 244 are arranged in a linear array along the longitudinal direction L, and are interleaved with the plurality of actuation pockets 240. The membrane 230 may be alternatively configured to define a plurality of openings (not shown), rather than the plurality of lenses 244. The plurality of openings may be configured to allow light emitted from the plurality of visual indicators (e.g., the plurality of LEDs 228) to pass into the actuator 250, for example directly rather than through the membrane 230. The plurality of openings may be arranged in a linear array along the longitudinal direction L, and may be interleaved with the plurality of actuation pockets 240.

The membrane 230 may be configured to at least partially receive the PCB 210. As shown, the membrane 230 defines a wall 246 that extends inward from the lower surface 230b of the membrane 230. The wall 246 may extend along a portion of an outer perimeter of the membrane 230 and may be dimensioned to surround a portion of the outer perimeter P of the PCB 210. The wall 246 may define a notch 248 dimensioned to receive a corresponding portion of the bump out 220 of the PCB 210.

The actuator 250 may be configured to actuate the plurality of actuation pockets 240. The actuator 250 may be made of any suitable material, for example plastic (e.g., a substantially rigid plastic). As shown, the actuator 250 defines a first end 252 and an opposed second end 254. The actuator 250 is elongate along the longitudinal direction L between the first and second ends 252, 254. The actuator 250 defines a first beam 256, a second beam 258, and a bridging member 260 that connects the first beam 256 to the second beam 258. The first beam 256 is dimensioned to be inserted into, and protrude beyond, the first opening 123 of the bezel 122, and defines a touch surface 262. The second beam 258 is dimensioned to be inserted into, and protrude beyond, the second opening 125 of the bezel 122, and defines a touch surface 264.

The first beam 256 may be referred to as an upper portion of the actuator 250 and may define a dimming level slider configured to facilitate adjustment of a dimming level provided to a lighting load by the load control device 100, responsive to a force applied to touch surface 262 of the first beam 256 (e.g., by a finger of a user of the load control device 100). The second beam 258 may be referred to as a lower portion of the actuator 250 and may define an ON/OFF button configured to switch the load control device between a first state in which power is provided to a lighting load (e.g., an ON state) by the load control device 100 and a second state in which power is not provided to the lighting load (e.g., an OFF state) by the load control device 100, responsive to a force applied to the touch surface 264 of the second beam 258 (e.g., by a finger of a user of the load control device 100). The actuation pocket 240 that is located closest to the first end 232 of the membrane 230 and is configured to be actuated by the post 266 supported by the second beam 258 may be referred to as an ON/OFF actuator pocket.

The actuator 250 includes a plurality of posts 266 that are configured to actuate corresponding ones of the plurality of actuation pockets 240 of the membrane 230. As shown, the plurality of posts 266 may extend downward from the first and second beams 256, 258. Each post 266 includes a foot 267 and a leg 268 that extends between the foot 267 and one of the first or second beams 256, 258. Each foot 267 defines a downward facing contact surface 269 that is configured to abut a corresponding one of the plurality of actuation pockets 240 of the membrane 230. The plurality of posts 266 are spaced apart from each other along a length of the actuator 250 (e.g., as defined by the first and second ends 252, 254). As shown, the posts 266 of the plurality of posts 266 are arranged along the actuator 250 in a linear array along the longitudinal direction L. The illustrated actuator 250 includes fourteen posts 266 supported by the first beam 256 and two posts 266 supported by the second beam 258.

The actuator 250 may be made of a translucent material, such that light emitted from the plurality of visual indicators (e.g., the plurality of LEDs 228) may cause one or more portions of the actuator (e.g., the first and second beams 256, 258) to be illuminated, for example by light that passes through one or more of the plurality of lenses 244 of the membrane 230.

The cradle 270 may be configured to support the actuator 250, the membrane 230, and the PCB 210. The cradle 270 may be made of any suitable material, for example plastic. As shown, the cradle 270 includes a body that defines a plurality of apertures 272 that extend through the body. Each aperture 272 is dimensioned to receive a corresponding one of the plurality of posts 266 supported by the actuator 250, such that the posts protrude into an interior of the cradle when the actuator 250 is supported by the cradle 270.

The body of the cradle 270 defines a recess 274 that extends into the body. The recess 274 may be dimensioned to at least partially enclose the membrane 230 and the PCB 210, such that the membrane 230 is supported by the cradle 270. When the actuator 250 is in an assembled position relative to the cradle 270, the posts 266 of the actuator 250 are received in corresponding ones of the apertures 272, such that the foot 267 of one or more of the posts 266 (e.g., each post 266) is positioned to actuate a corresponding actuation pocket 240. For example, the foot 267 of each post 266 may abut a corresponding one of the actuation pockets 240 when the actuator 250 is supported by the cradle 270.

The cradle 270 may be configured to facilitate releasable attachment of the cradle 270 to the yoke 130. As shown, the cradle 270 includes a first body portion 271 that defines the recess 274 and a second body portion 273 that is spaced apart from the first body portion 271. The first and second body portions 271, 273 may be spaced apart from each other by a distance that is substantially equal to a thickness of the yoke 130, such that at least a portion of the yoke 130 may be received between the first and second body portions 271, 273 when the cradle 270 is attached to the yoke 130. The second body portion 273 supports a pair of posts 278 that are dimensioned to be received in the notches 135 of the yoke 130. The first body portion 271 may include a latching member (not shown) configured to be received in, and engage with, the opening 131 in the yoke 130 when the cradle 270 is attached to the yoke 130.

Figure 7:
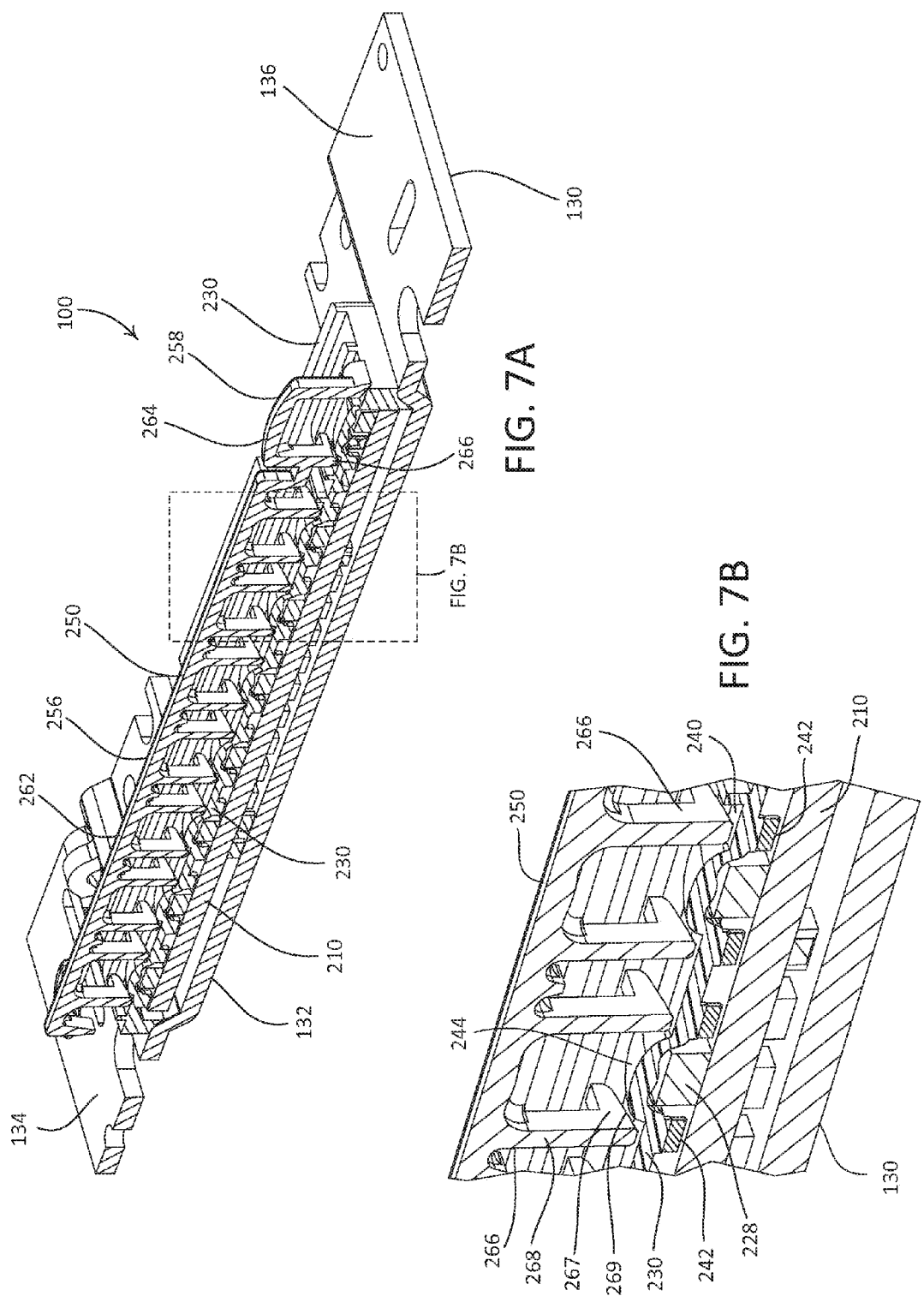
FIG. 7A is a perspective view of components of a wall-mounted dimmer switch having a touch interactive user interface, the components including a yoke, a cradle, a printed circuit board, a deformable membrane supporting a plurality of force-sensitive impedance members, and an actuator.
FIG. 7B is a zoomed perspective view of a portion of the components depicted in FIG. 7A.

FIGS. 7A and 7B illustrate select components of the load control device 100, in an assembled configuration. As shown, the PCB 210 is in an inserted position in the membrane 230, such that the plurality of force-sensitive impedance members 242 are spaced from corresponding ones of the plurality of open circuit pads 222. The membrane 230 is in an inserted position within the recess 274 of the cradle 270 (not shown in FIGS. 7A and 7B), such that the membrane 230 is supported by the cradle 270 (e.g., directly) and the PCB 210 is supported by the cradle 270 (e.g., indirectly). The actuator 250 is in an inserted position relative to the cradle 270, with the plurality of posts 266 inserted into respective ones of the plurality of apertures 272 of the cradle 270, such that each post 266 is substantially aligned with a corresponding one of the plurality of force-sensitive impedance members 242. With the actuator 250 in the inserted position relative to the cradle 270, at least a portion of the membrane 230 is disposed between the actuator 250 and the PCB 210. The cradle 270 is attached to the yoke 130.

The actuator 250 may be actuated by applying a force to one or both of the first beam 256 and the second beam 258. As shown, the load control device 100 is configured such that a user of the load control device 100 may apply a force to the touch surface 264 of the second beam 258 to cause the load control device 100 to switch power to an electrical load, for example a lighting load, that is electrically connected to the load control device 100 on or off.

Applying a force to the touch surface 264 of the second beam 258 may cause the post 266 supported by the second beam 258 to deform the corresponding actuation pocket 240 of the membrane 230 such that the respective force-sensitive impedance member 242 attached to the actuation pocket 240 makes electrical contact with the corresponding open circuit pad 222 supported by the PCB 210. The force-sensitive impedance member 242 may at least partially close an open circuit defined by the corresponding open circuit pad 222. The closed open circuit may cause the output of a signal, for example a control signal, to a controller of the load control device 100. The controller may, responsive to receiving the signal, cause the load control device 100 to switch delivery of power to the lighting load on or off.

The load control device 100 is configured such that a user of the load control device 100 may apply a force to the touch surface 262 of the first beam 256 to cause the load control device 100 to adjust a dimming level applied to the lighting load. For example, a user may apply a force, for example a point force, to a particular location along the touch surface 262 to cause the load control device to instantly apply a desired dimming level. The user may apply a force, for example a sliding or translating force, along a portion of the touch surface 262 to linearly increase or decrease the dimming level applied to the lighting load.

Applying a point force to the touch surface 262 of the first beam 256 may cause one or more posts 266 supported by the first beam 256 to deform corresponding actuation pockets 240 of the membrane 230 such that the respective force-sensitive impedance members 242 attached to the actuation pockets 240 make electrical contact with corresponding open circuit pads 222 supported by the PCB 210. The force-sensitive impedance members 242 may at least partially close respective open circuits defined by the corresponding open circuit pads 222. The closed open circuits may cause the output of a signal, for example a control signal, to the controller of the load control device 100. The controller may use the control signal (e.g., the magnitude of the control signal) to determine an amount of power to be delivered to the lighting load in accordance with a dimming level that corresponds to which ones of the plurality of open circuits are at least partially closed.

Applying a sliding force to the touch surface 262 of the first beam 256 may cause one or more posts 266 supported by the first beam 256 to deform corresponding actuation pockets 240 of the membrane 230 in succession such that the respective force-sensitive impedance members 242 attached to the actuation pockets 240 are placed into electrical contact with corresponding open circuit pads 222 supported by the PCB 210. For example, the force-sensitive impedance members 242 may be placed into electrical contact with respective open circuit pads 222 in succession, for example one after another. Two or more force-sensitive impedance members 242 may be placed into electrical contact with respective open circuit pads 222 substantially concurrently as the sliding force is applied to the touch surface 262 of the first beam 256.

The force-sensitive impedance members 242 may at least partially close respective open circuits defined by the corresponding open circuit pads 222. The at least partially closed open circuits may generate an output signal, for example a control signal. The control signal may be provided to the controller of the load control device 100. When a sliding force is applied to the touch surface 262 of the first beam 256, the succession of closed open circuits may cause the magnitude of the control signal provided to the controller of the load control device 100 to vary substantially continuously. The controller may use the magnitude of the control signal to determine an amount of power to be delivered to the lighting load in accordance with dimming levels that correspond to which ones of the plurality of open circuits are at least partially closed.

Figure 8:
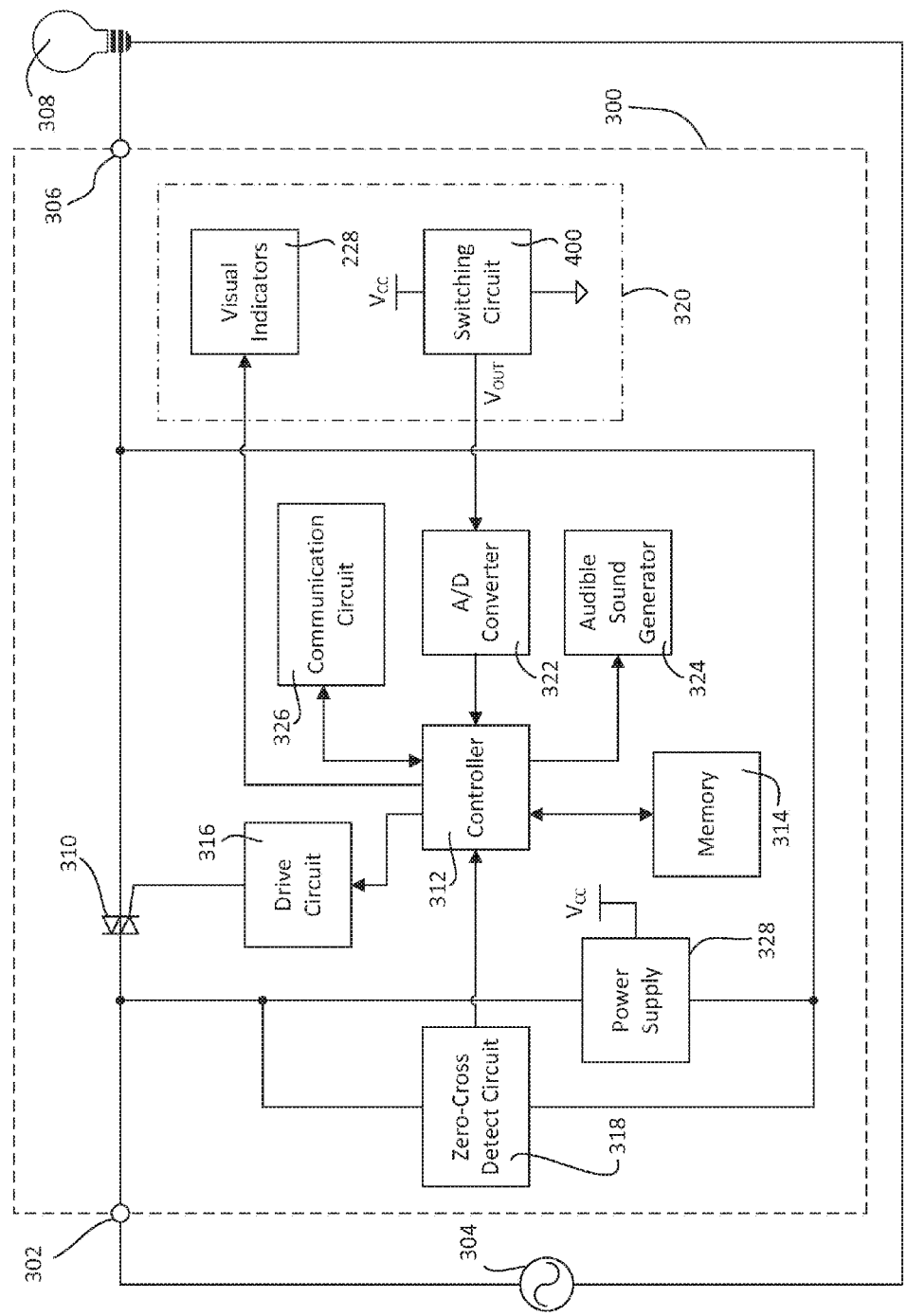
FIG. 8 is a simplified block diagram of an example wall-mounted dimmer switch having a touch interactive user interface.

FIG. 8 is a simplified block diagram of an example load control device 300 having a touch interactive user interface that may be, for example, the load control device 100 illustrated in FIG. 3. As shown, the load control device 300 includes a hot terminal 302 configured to be connected to an alternating current (AC) source 304 and a dimmed hot terminal 306 configured to be connected to an electrical load 308 (e.g., a lighting load). The load control device 300 is electrically connected in series between the AC source 304 and the electrical load 308.

The load control device 300 includes a controllably conductive device 310, for example a bidirectional semiconductor switch, such as a triac as shown in FIG. 8, that is configured to be electrically coupled between the source 304 and the load 308. The controllably conductive device 310 may be operable between a non-conductive state in which the gate is open such that AC from the source 304 is not delivered to the load 308 and a conductive state in which the gate is closed such that AC from the source 304 passes through the controllably conductive device 310 and is delivered to the load 308. The controllably conductive device 310 may be referred to as "off" when in the non-conductive state and "on" when in the conductive state. Alternatively, the controllably conductive device 310 may be implemented as a relay or any suitable bidirectional semiconductors switch, such as, for example, a field-effect transistor (FET) in a rectifier bridge, two FETs in anti-series connection, or one or more insulated-gate bipolar junction transistors (IGBTs).

The load control device 300 may include a controller 312. The controller 312 may cause the controllably conductive device 310 to operate between the conductive and non-conductive states, respectively. The controller 312 may include one or more components, such as processors (e.g., microprocessors), microcontrollers, integrated circuits (e.g., field programmable gate arrays), or the like, in any combination. For example, the controller 312 may include a processor (not shown) that may execute computer-executable instructions in order to control one or more functional aspects of the load control device 300.

The load control device 300 may include a memory 314. The memory 314 may be communicatively coupled to the controller 312 and may operate to store information such as computer-executable instructions, configuration settings associated with operation of the load control device 300, or the like. The memory 314 may include any component suitable for storing the information. For example, the memory 314 may include one or more components of volatile and/or non-volatile memory, in any combination. The memory 314 may be internal and/or external with respect to the controller 312. For example, the memory 314 and the controller 312 may be integrated within a microchip. During operation of the load control device 300, the controller 312 may store and/or retrieve information, for instance the computer-executable instructions, from the memory 314. It should be appreciated that functionality of the controller 312 may include any combination of hardware, firmware, and/or software.

As shown, the load control device 300 includes a drive circuit 316 that is electrically connected between the controller 312 and the controllably conductive device 310 and is communicatively coupled to the controller 312. The drive circuit 316 may include circuitry configured to convert control signals issued by the controller 312 into triggering signals that may trigger the controllably conductive device 310 to operate between the non-conductive state and the conductive state. The load control device 300 includes a zero-cross detection circuit 318 configured to detect zero crossing events associated with an AC waveform generated by the source 304.

The controller 312 may issue control signals to the drive circuit 316 in accordance with a prescribed interval. For example, the controller 312 may be made aware of a zero crossing event associated with an AC line voltage generated by the source 304 (e.g., via the zero-cross detection circuit 318). The controller 312 may be configured to, upon detection of the zero crossing, issue a control signal to the drive circuit 316 to operate the controllably conductive device 310 from the conductive state to the non-conductive state (i.e., to open the gate) for a duration of the prescribed interval and, upon expiration of the interval, to operate the controllably conductive device 310 from the non-conductive state to the conductive state (i.e., to close the gate). The expiration of the interval may substantially coincide with a subsequent, consecutive zero crossing event associated with the AC waveform generated by the source 304.

The load control device 300 includes a control interface 320 that may be configured as a touch interactive user interface. The control interface 320 may include, for example, a switching circuit (e.g., the switching circuit 400 illustrated in FIG. 9) that may include the plurality of open circuit pads 222 supported by the PCB 210 of the actuator assembly 200, and the plurality of visual indicators (e.g., the plurality of LEDs 228). The control interface 320 may provide one or more inputs to the controller 312, for example a $V_{OUT}$ signal indicative of an amount power to be delivered to the load 308. The control interface 320 may receive one or more inputs from the controller 312, for example commands to cause one or more of the plurality of LEDs 228 to illuminate in order to indicate to a user the amount power being delivered to the load 308 (e.g., responsive to a touch interaction with the actuator 250).

The load control device 300 may include an analog to digital (A/D) converter 322 that may be electrically connected between the control interface 320 and the controller 312. The A/D converter 322 may receive respective analog waveform information (e.g., $V_{OUT}$), may convert the analog waveform information into respective digital waveform information, and may communicate the digital waveform information to the controller 312.

The load control device 300 may include an audible sound generator 324 configured to produce an audible sound, for example in response to an actuation of the actuator 250. The audible sound generator 324 may function, for example, as described in greater detail in U.S. Pat. No. 8,173,920, issued May 8, 2012, entitled "Load Control Device Having A Modular Assembly," the entire disclosure of which is hereby incorporated by reference.

The load control device 300 may include a communication circuit 326 that is communicatively coupled to the controller 312. The communication circuit 326 may include one or more components operable for the transmission and/or reception of information that may include signals and/or data. For instance, the communication circuit 326 may include a transceiver, a modem, and/or the like. The controller 312 may be configured to receive commands and/or configuration information pertaining to operation of the load control device 300 via the communication circuit 326. For example, the controller 312 may receive information, such as operational commands, via the communication circuit 326 from one or more external devices such as a sensor (e.g., a daylight sensor configured for wireless communication), a communication device associated with a user of the load control device 300 (e.g., a smart phone, computer, etc.), or the like. The controller 312 may be configured to transmit information via the communication circuit 326 (e.g., a report pertaining to a current dimming level of the load control device 300).

The communication circuit 326 may be configured with respective capabilities to transmit and/or receive information in accordance with one or more communication schemes. For example, the communication circuit 326 may be configured to be capable of transmitting and/or receiving information via radio frequency (RF) communication, low voltage communication such as low-voltage differential signaling (LVDS), and/or power line communication (PLC) schemes.

The load control device 300 may include a power supply 328 configured to supply power to one or more components of the load control device 300, for instance when the controllably conductive device 310 is in the conductive state. The power supply 328 may be configured to accumulate and store electricity when a voltage associated with the source 304 is dropped across the load control device 300, for instance when the controllably conductive device 310 is in the non-conductive state. The stored electricity may be used to supply power to one or more components of the load control device 300.

It should be appreciated that one or more of the above-described components of the load control device 300, such as the memory 314, the drive circuit 316, the zero-cross detection circuit 318, the A/D converter 322, the audible sound generator 324, and/or the communication circuit 326, may be at least partially integrated with (e.g., completely integrated with) the controller 312, for example within a single microchip, such as an integrated circuit.

FIG. 9 depicts an example switching circuit 400 that may be implemented, for example, in the load control device 100 or the load control device 300. The switching circuit 400 may include a plurality of impedance elements and a plurality of open circuits that are in electrical communication with select ones of the plurality of impedance elements. The plurality of impedance elements may include, for example, the plurality of resistors 223 supported by the second surface 210b of the PCB 210. The plurality of open circuits may include, for example, the plurality of open circuit pads 222 supported by the first surface 210a of the PCB 210. The switching circuit 400 generates an output voltage signal $V_{OUT}$ that may be received by a control circuit (e.g., the controller 312 of the load control device 300 shown in FIG. 8).

As shown, the switching circuit 400 includes fifteen resistors 223 (labeled R1, R2 . . . R15) and fourteen open circuit pads 222 (labeled OC1, OC2 . . . OC14). Each open circuit pad 222 is in electrical communication with at least one of the plurality of resistors 223. The switching circuit 400 includes a plurality of junctions 227. Each resistor 223 is electrically connected to at least one adjacent resistor 223 and to a corresponding open circuit pad 222 at one of the plurality of junctions 227. For example, R1, R2, and OC1 are electrically connected to each other at a first one of the plurality of junctions 227; R2, R3, and OC2 are electrically connected to each other at a second one of the plurality of junctions 227, and so on. It should be appreciated that the switching circuit is not limited to the illustrated arrangement of impedance elements and open circuits. For example, the switching circuit may be alternatively configured using more or fewer impedance elements, open circuits, and/or junctions, in any suitable arrangement.

The switching circuit 400 may be configured such that each open circuit pad 222 may be at least partially closed by a corresponding one of the plurality of force-sensitive impedance members 242. For example, if a force is applied to a location on the actuator 250, the actuator 250 may bias the membrane 230 such that one or more of the plurality of force-sensitive impedance members 242 makes contact with, and is placed in electrical communication with, a corresponding one of the plurality of open circuit pads 222.

The plurality of force-sensitive impedance members 242, for example activated carbon structures such as carbon pills, may provide varying impedance in accordance with the amount of force applied to the force-sensitive impedance members 242. For example, when a force-sensitive impedance member 242 is actuated against a corresponding open circuit pad 222 with full force, the force-sensitive impedance member 242 may substantially close the corresponding open circuit, for example such that the open circuit pad 222 is effectively closed, and may impart a negligible resistance (e.g., substantially no resistance). When a force-sensitive impedance member 242 is actuated against a corresponding open circuit pad 222 with less than full force, the force-sensitive impedance member 242 may partially close the corresponding open circuit, for example such that the open circuit pad 222 is less than fully open, and may impart some resistance to the switching circuit 400.

Actuation of a first force-sensitive impedance member 242a (e.g., to contact the open circuit pad OC2) may produce a first impedance, for example a first resistance, in series between the controller 312 and the junction of the second and third resistors R2, R3. Actuation of a second force-sensitive impedance member 242b (e.g., to contact the open circuit pad OC3) may produce a second impedance, for example a second resistance, that is different from the first impedance, in series between the controller 312 and the junction of the third and fourth resistors R3, R4. If the first and second impedance members 242a, 242b are actuated concurrently (e.g., substantially concurrently) a third resistance may be produced between the controller 312 and the junction of the second and third resistors R2, R3, and a fourth resistance may be produced between the controller 312 and the junction of the third and fourth resistor R3, R4. The third and fourth resistances may be less than the first and second resistances.

Each force-sensitive impedance member 242, a corresponding open circuit pad 222, and one or more of the plurality of resistors 223 electrically connected to the open circuit pad 222 at a corresponding one of the plurality of junctions 227 may define a respective one of a plurality of switching elements. The actuation of one or more switching elements of the switching circuit 400, for example responsive to operation of the actuator 250, may generate one or more respective signals that can be interpreted by a load control device, for example the load control device 100 or the load control device 300, into an amount of power to be delivered to an electrical load electrically connected to the load control device (e.g., a lighting load). For example, the load control device may translate the one or more signals into a desired dimming level to be applied to the lighting load.

To illustrate, an input supply line voltage $V_{CC}$ may be applied across the switching circuit 400 by a load control device, for example the load control device 100 or the load control device 300. When one or more of the plurality of open circuits defined by the plurality of open circuit pads 222 is closed, for example due to actuation of one or more of the plurality of switching elements, the switching circuit 400 may produce the output voltage signal $V_{OUT}$. The output voltage signal $V_{OUT}$ may be provided as a control signal to the controller of a load control device, for example the controller 312 of the load control device 300. The magnitude of the output voltage signal $V_{OUT}$ may be indicative of an amount of power that should be delivered to an electrical load (e.g., a lighting load) electrically connected to the load control device 300.

FIG. 10A depicts an example equivalent circuit 500 of the switching circuit 400 when a single force-sensitive impedance member 242 is actuated against a corresponding open circuit pad 222, with full force applied to the force-sensitive impedance member 242. As shown, when a force-sensitive impedance member 242a is actuated with full pressure against the open circuit pad OC2 (see FIG. 9), the force-sensitive impedance member 242a acts as a short circuit. This is shown in FIG. 10A as a resistor with a value of zero ohms. Now, the switching circuit 400 may function as a voltage divider, such that an output $V_{OUT\_A}$ of the equivalent circuit 500 may be expressed as $$V_{OUT\_A} = V_{CC}\left(\frac{\sum R3 \ldots R15}{\sum R1 \ldots R15}\right).$$

The output $V_{OUT\_A}$ may be provided as a control signal, for example to the controller 312 of the load control device 300. The output $V_{OUT\_A}$ may be converted into a digital signal, for example by the A/D converter 322. The controller 312 may use the output $V_{OUT\_A}$ to determine a corresponding first dimming level to be applied to a lighting load electrically connected to the load control device 300. For example, the controller 312 may use the output $V_{OUT\_A}$ to retrieve a first predetermined dimming level associated with the output $V_{OUT\_A}$. A database of predetermined dimming levels may be stored, for example, in the memory 314.

FIG. 10B depicts an example equivalent circuit 600 of the switching circuit 400 when a single force-sensitive impedance member 242 is actuated against a corresponding open circuit pad 222, with full force applied to the force-sensitive impedance member 242. As shown, when a force-sensitive impedance member 242b is actuated with full pressure against the open circuit pad OC3 (see FIG. 9), the force-sensitive impedance member 242b acts as a short circuit. This is shown in FIG. 10B as a resistor with a value of zero ohms. Now, the switching circuit 400 may function as a voltage divider, such that an output $V_{OUT\_B}$ of the equivalent circuit 600 may be expressed as $$V_{OUT\_B} = V_{CC}\left(\frac{\sum R4 \ldots R15}{\sum R1 \ldots R15}\right).$$

With resistors 223 of equal value, for example if resistors R1-R15 are of equal value, the output $V_{OUT\_A}$ is larger than the output $V_{OUT\_B}$. The output $V_{OUT\_B}$ may be converted to a digital signal by the A/D converter 322 and provided as a control signal to the controller 312. The controller 312 may use the output $V_{OUT\_B}$ to determine a corresponding second dimming level to be applied to a lighting load electrically connected to the load control device 300. For example, the controller 312 may use the output $V_{OUT\_B}$ to retrieve a second predetermined dimming level associated with the output $V_{OUT\_B}$. The second dimming level may be higher or lower than the first dimming level, for example in accordance with the respective positions of the corresponding open circuit pads 222 within the switching circuit 400.

As described above with reference to FIGS. 10A and 10B, both the force-sensitive impedance members 242a and 242b were pressed fully. If the force-sensitive impedance members 242a and/or 242b were pressed lightly (e.g., actuated with less than a full force), the resulting outputs $V_{OUT\_A}$ and $V_{OUT\_B}$, respectively, would be substantially the same. If actuated with light presses, the force-sensitive impedance members 242a, 242b would have a non-zero resistance, but with substantially no current flowing through the force-sensitive impedance members 242a, 242b, the respective voltage drops across the force-sensitive impedance members 242a, 242b would be negligible.

FIG. 10C depicts an example equivalent circuit 700 of the switching circuit 400 when two or more force-sensitive impedance members 242 are actuated, for example concurrently (e.g., substantially concurrently), against corresponding open circuit pads 222, with less than full force applied to the force-sensitive impedance members 242. Two or more force-sensitive impedance members 242 may be concurrently actuated, for example, when a force is applied at a location along the actuator 250 that is between adjacent posts 266. As shown, when first and second force-sensitive impedance members 242a, 242b (see FIG. 9) are concurrently actuated with less than full pressure, the first and second force-sensitive impedance members 242a, 242b may partially close corresponding open circuits. The first and second force-sensitive impedance members 242a, 242b may each impart some resistance to the switching circuit 400, for example resistances $R_A$ and $R_B$, respectively. The resistances $R_A$ and $R_B$ may result in an output $V_{OUT\_C}$ of the equivalent circuit 700.

If the force is applied at a location along the actuator 250 that is between the first and second force-sensitive impedance members 242a, 242b and closer to the first force-sensitive impedance member 242a than to the second force-sensitive impedance member 242b, for example closer to the open circuit pad OC2 than to the open circuit pad OC3, the resistance $R_A$ will be less than the resistance $R_B$ and the magnitude of the output $V_{OUT\_C}$ will be closer to the magnitude of the output $V_{OUT\_A}$ than to the magnitude of the output $V_{OUT\_B}$.

If the force is applied at a location along the actuator 250 that is substantially equidistant between the first and second force-sensitive impedance members 242a, 242b, for example substantially equidistant between the open circuit pads OC2 and OC3, the resistances $R_A$ and $R_B$ will be approximately equal and the magnitude of the output $V_{OUT\_C}$ will be approximately the average of the magnitudes of the output $V_{OUT\_A}$ and the output $V_{OUT\_B}$.

If the force is applied at a location along the actuator 250 that is between the first and second force-sensitive impedance members 242a, 242b and closer to the second force-sensitive impedance member 242b than to the first force-sensitive impedance member 242a, for example closer to the open circuit pad OC3 than to the open circuit pad OC2, the resistance $R_B$ will be less than the resistance $R_A$ and the magnitude of the output $V_{OUT\_C}$ will be closer to the magnitude of the output $V_{OUT\_B}$ than to the magnitude of the output $V_{OUT\_A}$ (e.g., less than the magnitude of the output $V_{OUT\_C}$ when the force is applied closer to the open circuit pad OC2).

The output voltage signal $V_{OUT}$ (e.g., the outputs $V_{OUT\_A}$, $V_{OUT\_B}$, $V_{OUT\_C}$) may be converted to a digital signal by the A/D converter 322 and provided as a control signal to the controller 312. The controller 312 may use the outputs $V_{OUT\_A}$, $V_{OUT\_B}$, $V_{OUT\_C}$ to determine a corresponding second dimming level to be applied to a lighting load electrically connected to the load control device 300. For example, the controller 312 may use the outputs $V_{OUT\_A}$, $V_{OUT\_B}$, $V_{OUT\_C}$ to retrieve a predetermined dimming level associated with a value that is closest to that of the outputs $V_{OUT\_A}$, $V_{OUT\_B}$, $V_{OUT\_C}$. Alternatively, the controller 312 may interpolate a dimming level based on the outputs $V_{OUT\_A}$, $V_{OUT\_B}$, $V_{OUT\_C}$ that is between two predetermined dimming levels.

The switching circuit 400, in cooperation with the plurality of force-sensitive impedance members 242, enables a continuous (e.g., substantially linear) variation of the output voltage signal $V_{OUT}$ of the switching circuit 400 as respective consecutive force-sensitive impedance members 242 are sequentially actuated. For example, as illustrated in FIGS. 10A-10C, if the first and second force-sensitive impedance members 242a, 242b are actuated in a continuous manner, as may result from a user of the load control device 100 applying a sliding force to the actuator 250 from the a first location along the actuator 250 that corresponds to the first force-sensitive impedance member 242a to the a second location along the actuator 250 that correspond to the second force-sensitive impedance member 242b, the output voltage signal $V_{OUT}$ provided to the controller of the load control device 100 by the switching circuit 400 will vary substantially continuously.

As shown, when the user applies the force to the actuator 250 at the first location corresponding to the first force-sensitive impedance member 242a, the switching circuit 400 will provide the output $V_{OUT\_A}$ to the controller of the load control device 100 (e.g., as illustrated in FIG. 10A). As the location at which the force is applied to the actuator 250 by the user moves beyond the first location and toward the second location, the switching circuit 400 may provide one or more output signals that may correspond to one or more locations between the first and second locations along the actuator 250, for example output $V_{OUT\_C}$, to the controller of the load control device 100 (e.g., as illustrated in FIG. 10C). When the location at which the force is applied to the actuator 250 reaches the second location corresponding to the second force-sensitive impedance member 242b, the switching circuit 400 will provide the output $V_{OUT\_B}$ to the controller of the load control device 100 (e.g., as illustrated in FIG. 10B). The controller of the load control device may, in response to receiving the continuous outputs $V_{OUT\_A}$, $V_{OUT\_C}$, $V_{OUT\_B}$, apply corresponding continuous dimming levels to an electrical load (e.g., a lighting load) electrically connected to the load control device 100.

Figure 11:
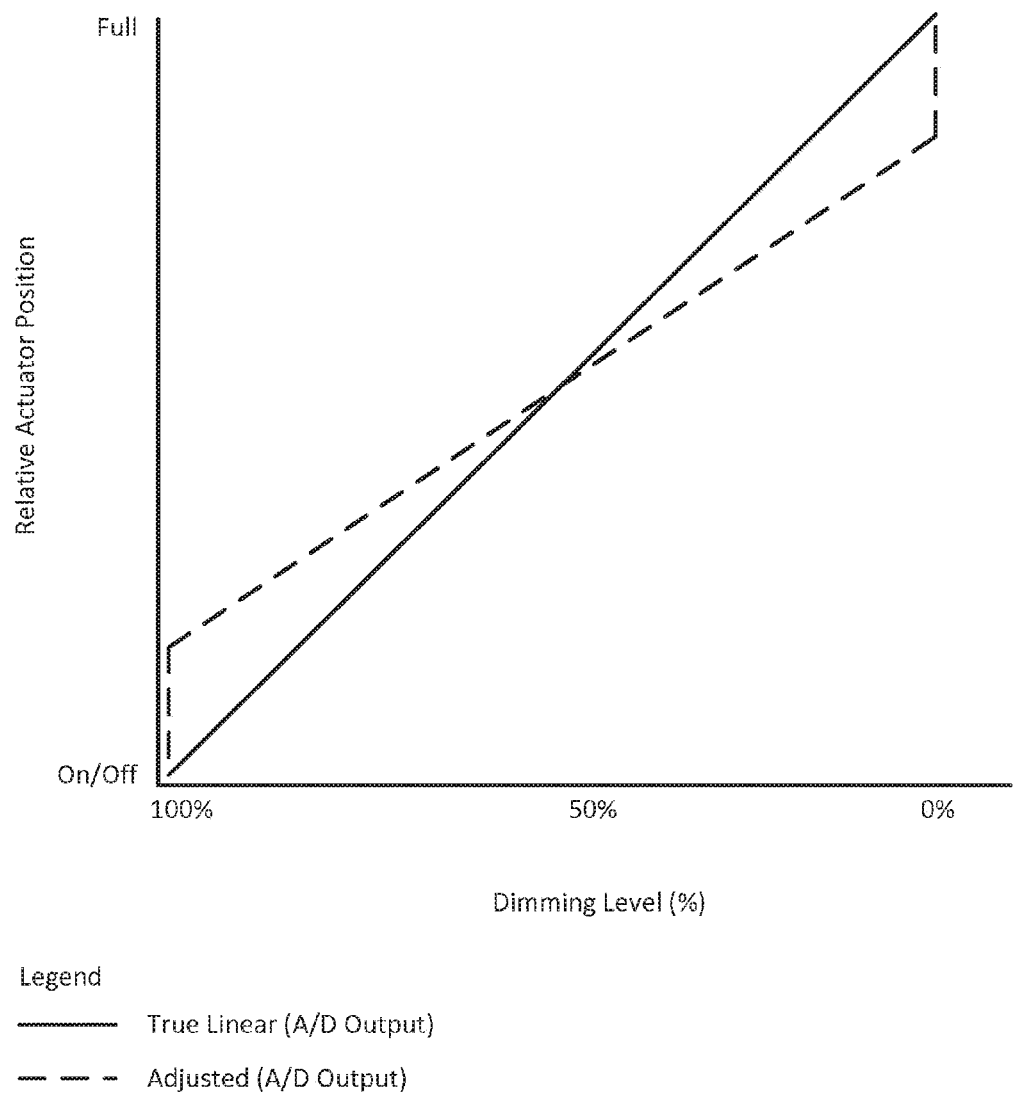
FIG. 11 is a graph depicting examples of true linear and adjusted outputs of an example wall-mounted dimmer switch having a touch interactive user interface.

FIG. 11 depicts the true linear output and an adjusted output of an example load control device (e.g., the load control device 100 or the load control device 300) having a touch interactive user interface. A controller (e.g., the controller 312 of the load control device 300) may be configured to adjust the output voltage of the load control device 300, and thus the power delivered to the load 308. So adjusting the output voltage may enhance ease of use of the load control device 300. The controller 312 of the load control device 300 may adjust the output voltage in accordance with a predetermined scheme (e.g., a scheme stored in the memory 314). As shown, the output voltage may be adjusted such that when a force is applied to the actuator 250 proximate the first end 252 (e.g., at a location between the first end 252 and a short distance from the first end 252), the controller 312 will maintain the dimming level at approximately 100%. Similarly, when a force is applied to the actuator 250 proximate the second end 254 (e.g., at a location between the second end 254 and a short distance from the second end 254), the controller 312 will maintain the dimming level at approximately 0%.

It should be appreciated that the actuator assembly 200, while illustrated and described herein with reference to implementations in load control devices configured to control the amount of power delivered to associated lighting loads, is not limited to such applications. For example, the actuator assembly 200 may alternatively be implemented, for example, in a remote control device. The actuator assembly of the remote control device may include, for example, an actuator having one or more discrete portions configured to operate as ON/OFF buttons (e.g., that function similarly to the second beam 258 of the actuator 250) and/or one or more portions configured to operate as slider controls (e.g., that function similarly to the first beam 256 of the actuator 250). The slider controls of the remote control device may be configured to control, for example, lighting levels, temperature levels, volume levels, the operation of associated window treatments, or the like. The actuator assembly 200 may also be implemented directly on (e.g., attached to) a device that the actuator assembly 200 is configured to control, for example a lamp, a display device such as a TV, or the like.

The invention claimed is:

1. A touch-sensitive actuator assembly configured for use with a load control device configured to control an amount of power delivered to an electrical load, the actuator assembly comprising:
   a resilient, deformable membrane supporting a plurality of discrete force-sensitive impedance members; and
   an actuator having a plurality of posts that are spaced from each other, each post configured to transfer a force applied to the actuator at a location proximate to the post to a corresponding location on the membrane;
   wherein, in response to the transferred force, the membrane is configured to deform and actuate at least one of the plurality of discrete force-sensitive impedance members; and
   wherein each of the plurality of discrete force-sensitive impedance members is configured to, when actuated, cause the load control device to apply one of a plurality of dimming levels to the electrical load.

2. The actuator assembly of claim 1, wherein each of the plurality of dimming levels may be modified based upon a magnitude of the force applied to the actuator.

3. The actuator assembly of claim 1, wherein the actuator is elongate between a first end and an opposed second end, and applying the force along the actuator between the first and second ends corresponds to linear transitions between two or more of the plurality of dimming levels.

4. The actuator assembly of claim 1, wherein each of the plurality of force-sensitive impedance members is configured to contact a corresponding one of a plurality of impedance element junctions when the actuator is actuated to deform the membrane.

5. The actuator assembly of claim 4, wherein each of the plurality of impedance element junctions corresponds to one of the plurality of dimming levels.

6. The actuator assembly of claim 1, wherein actuation of a first force-sensitive impedance member produces a first impedance,
   actuation of a second force-sensitive impedance member produces a second impedance that is different from the first impedance, and
   substantially concurrent actuation of the first and second force-sensitive impedance members produces a third impedance that is between the first impedance and the second impedance, wherein the third impedance is based on a location of the force applied to the actuator between the first and second force-sensitive impedance members.

7. The actuator assembly of claim 1, wherein when the force is applied to the actuator at a location between respective first and second posts of the plurality of posts, the amount of power delivered to the electrical load by the load control device is derived from a first dimming level associated with a first force-sensitive impedance member actuated by the first post and a second dimming level associated with a second force-sensitive impedance member actuated by the second post.

8. The actuator assembly of claim 7, wherein the dimming level applied by the load control device is a blend of the first and second dimming levels based on the location along the actuator where the force is applied.

9. The actuator assembly of claim 1, wherein the deformable membrane is rubber.

10. A touch-sensitive actuator assembly configured for use with a load control device configured to control an amount of power delivered to an electrical load, the actuator assembly comprising:
    a rubber membrane supporting a plurality of discrete force-sensitive impedance members; and
    an actuator having a plurality of posts that are spaced apart from each other, wherein in response to receiving a force, the one or more of the plurality of posts of the actuator are configured to deform the rubber membrane to actuate at least one of the plurality of discrete force-sensitive impedance members with an amount of force;
    wherein the at least one of the plurality of discrete force-sensitive impedance members is configured to provide an impedance in accordance with the amount of force applied to the force-sensitive impedance member when actuated by the rubber membrane; and
    wherein the load control device is configured to apply one of a plurality of dimming levels to the electrical load based on a voltage output set by the impedance in response to the impedance provided by the at least one of the plurality of discrete force-sensitive impedance members.

11. The touch-sensitive actuator assembly of claim 10, wherein the plurality of discrete members are comprised of activated carbon.

12. The touch-sensitive actuator assembly of claim 11, wherein when one of the force-sensitive impedance members is actuated with the amount of force providing a full pressure against a corresponding open circuit pad, the impedance is substantially small.

13. The touch-sensitive actuator assembly of claim 11, wherein when first and second force-sensitive impedance members are actuated substantially concurrently by the amount of force, the impedance is based on a location of a pressure applied to the actuator between the first and second force-sensitive impedance members.

* * * * *